United States Patent
Jung et al.

(10) Patent No.: US 11,133,202 B2
(45) Date of Patent: Sep. 28, 2021

(54) SUBSTRATE HEATING APPARATUS WITH ENHANCED TEMPERATURE UNIFORMITY CHARACTERISTIC

(71) Applicant: MICO LTD., Anseong-si (KR)

(72) Inventors: Chul Ho Jung, Incheon (KR); Jin Young Choi, Anseong-si (KR); Yoon Ho Choi, Anseong-si (KR)

(73) Assignee: MiCo Ceramics Ltd., Anseong-si (KR)

( * ) Notice: Subject to any disclaimer, the term of this patent is extended or adjusted under 35 U.S.C. 154(b) by 201 days.

(21) Appl. No.: 15/754,112

(22) PCT Filed: Sep. 30, 2016

(86) PCT No.: PCT/KR2016/010960
§ 371 (c)(1),
(2) Date: Feb. 21, 2018

(87) PCT Pub. No.: WO2017/061734
PCT Pub. Date: Apr. 13, 2017

(65) Prior Publication Data
US 2018/0254204 A1   Sep. 6, 2018

(30) Foreign Application Priority Data
Oct. 5, 2015   (KR) .................. 10-2015-0139849

(51) Int. Cl.
*H01L 21/67* (2006.01)
*C23C 14/54* (2006.01)
(Continued)

(52) U.S. Cl.
CPC ...... *H01L 21/67103* (2013.01); *C23C 14/541* (2013.01); *C23C 16/4586* (2013.01);
(Continued)

(58) Field of Classification Search
CPC ......... H01L 21/67103; H01L 21/67109; H01L 21/68742; C23C 14/541; C23C 16/4586;
(Continued)

(56) References Cited

U.S. PATENT DOCUMENTS 9,123,757 B2* 9/2015 Unno ................ H01L 21/67103
2002/0158328 A1 10/2002 Hiramatsu et al.
(Continued)

FOREIGN PATENT DOCUMENTS

JP         S5613389 U   2/1981
JP         S6139870 U   3/1986
(Continued)

OTHER PUBLICATIONS

Japanese Patent Abstract (in English) of JP Patent No. 2001102157 A, Pub. Date Apr. 13, 2001, downloaded Feb. 20, 2018 from https://worldwide.espacenet.com/.
(Continued)

*Primary Examiner* — Tuan N Nguyen
(74) *Attorney, Agent, or Firm* — Barcelo, Harrison & Walker, LLP

(57) ABSTRACT

The present invention relates to a substrate heating apparatus. More specifically, the present invention relates to a substrate heating apparatus including a first heating element located in an inner region of the substrate heating apparatus, a second heating element located in an outer region, and a third heating element supplying current to the second heating element passing through the inner region, wherein the diameter of a wire constituting the third heating element is thicker than the diameter of a wire constituting the second heating element, thereby inhibiting the generation of an overheating region by the heating of the third heating element.

6 Claims, 12 Drawing Sheets

(51) Int. Cl.
  *C23C 16/46* (2006.01)
  *C23C 16/458* (2006.01)
  *H01L 21/687* (2006.01)
  *H05B 3/14* (2006.01)
  *H05B 3/28* (2006.01)

(52) U.S. Cl.
  CPC ........ C23C 16/46 (2013.01); H01L 21/67109 (2013.01); H01L 21/68742 (2013.01); H01L 21/68785 (2013.01); H05B 3/143 (2013.01); H05B 3/283 (2013.01); H05B 2203/014 (2013.01); H05B 2203/037 (2013.01)

(58) Field of Classification Search
  CPC ........ C23C 16/46; H05B 3/143; H05B 3/283; H05B 2203/014; H05B 2203/037
  USPC ..................................... 219/444.1
  See application file for complete search history.

(56) References Cited

U.S. PATENT DOCUMENTS

| | | | |
|---|---|---|---|
| 2003/0047555 A1 | 3/2003 | Keum et al. | |
| 2003/0173349 A1* | 9/2003 | Unno | H01L 21/67103 219/444.1 |
| 2009/0123140 A1* | 5/2009 | Komatsu | H01L 21/67103 392/418 |
| 2013/0217250 A1* | 8/2013 | Melni | H01R 4/12 439/271 |
| 2013/0284721 A1 | 10/2013 | Yang et al. | |

FOREIGN PATENT DOCUMENTS

| | | |
|---|---|---|
| JP | H0782909 B2 | 9/1995 |
| JP | H07335357 A | 12/1995 |
| JP | 2518962 B2 | 7/1996 |
| JP | 2001-102157 A | 4/2001 |
| JP | 2003-272805 A | 9/2003 |
| JP | 2004006242 A | 1/2004 |
| JP | 2005519427 A | 6/2005 |
| JP | 2006-005095 A | 1/2006 |
| JP | 2007-088484 A | 4/2007 |
| JP | 2008-021963 A | 1/2008 |
| JP | 2009-076598 A | 4/2009 |
| JP | 2009-094137 A | 4/2009 |
| JP | 2014099313 A | 5/2014 |
| KR | 10-2012-0112661 A1 | 10/2012 |
| KR | 101439279 31 | 9/2014 |
| KR | 2014-0118461 A | 10/2014 |
| TW | 200304757 A | 10/2003 |
| TW | 201401421 A | 1/2014 |
| WO | 03073792 A1 | 9/2003 |
| WO | 2004019658 A1 | 3/2004 |
| WO | 2009-113451 A1 | 9/2009 |
| WO | 2011-081049 A1 | 7/2011 |

OTHER PUBLICATIONS

Japanese Patent Abstract (in English) of JP Patent No. 2006005095 A, Pub. Date Jan. 5, 2006, downloaded Feb. 20, 2018 from https://worldwide.espacenet.com/.
Japanese Patent Abstract (in English) of JP Patent No. 2007088484 A, Pub. Date Apr. 5, 2007, downloaded Feb. 20, 2018 from https://worldwide.espacenet.com/.
Korean Patent Abstract (in English) of KR Patent Pub No. 20140118461 A, Pub. Date Oct. 8, 2014, downloaded Feb. 20, 2018 from https://worldwide.espacenet.com/.
Korean Patent Abstract (in English) of KR Patent Pub No. 10-2012-0112661 A1, Pub. Date Oct. 11, 2012, downloaded Feb. 20, 2018 from http://engpat.kipris.or.kr/engpat.
WIPO Patent Abstract (in English) of WO Patent Pub No. 2011081049 A1, Pub. Date Jul. 7, 2011, downloaded Feb. 20, 2018 from https://patentscope.wipo.int/search/en/.
International Search Report of WO Patent Pub No. 2011081049 A1, Pub. Date Jul. 7, 2011, dated Jul. 2009.
WIPO Patent Abstract (in English) of WO Patent Pub No. 2009113451 A1, Pub. Date Sep. 17, 2009, downloaded Feb. 20, 2018 from https://patentscope.wipo.int/search/en/.
Japanese Patent Abstract (in English) of JP Patent No. 2009094137 A, Pub. Date Apr. 30, 2009, downloaded Feb. 20, 2018 from https://www4.j-platpat.inpit.go.jp/eng/t.
Japanese Patent Abstract (in English) of JP Patent No. 2008-021963 A, Pub. Date Jan. 31, 2008, downloaded Feb. 20, 2018 from https://www4.j-platpat.inpit.go.jp/eng/t.
Japanese Patent Abstract (in English) of JP Patent No. 2009-076598 A, Pub. Date Apr. 9, 2009, downloaded Feb. 20, 2018 from https://www4.j-platpat.inpit.go.jp/eng/t.
Taiwan Patent Abstract (in English) of Taiwan Patent App. Pub. No. TW201401421 (A), Pub. Date Jan. 1, 2014, downloaded May 13, 2020, from https://worldwide.espacenet.com.
Office Action and Search Report (in Chinese) for Taiwan Patent Application No. TW105130565, dated Oct. 5, 2015.
Taiwan Patent Abstract (in English) of Taiwan Patent App. Pub. No. TW 200304757 (A), Pub. Date Oct. 1, 2003, downloaded on Aug. 18, 2020, from https://worldwide.espacenet.com.
Japanese Patent Abstract (in English) of Japanese Patent App. Pub. No. JP 2518962 (B2), Pub. Date Jul. 31, 1996, downloaded on Aug. 18, 2020, from https://worldwide.espacenet.com.
Japanese Patent Abstract (in English) of Japanese Patent App. Pub. No. JP H07-82909 (B2), Pub. Date Sep. 6, 1995, downloaded on Aug. 18, 2020, from https://worldwide.espacenet.com.
Japanese Patent Abstract (in English) of Japanese Patent App. Pub. No. JP 2005-519427 (A), Pub. Date Jun. 30, 2005, downloaded on Aug. 18, 2020, from https://worldwide.espacenet.com.
Japanese Patent Abstract (in English) of Japanese Patent App. Pub. No. JP 2014-099313 (A), Pub. Date May 29, 2014, downloaded on Aug. 18, 2020, from https://worldwide.espacenet.com.
Japanese Patent Abstract (in English) of Japanese Patent App. Pub. No. JP 2004-006242 (A), Pub. Date Jan. 8, 2004, downloaded on Aug. 18, 2020, from https://worldwide.espacenet.com.
Japanese Patent Abstract (in English) of Japanese Patent App. Pub. No. JP S61-39870 (U), Pub. Date Mar. 13, 1986.
Japanese Patent Abstract (in English) of Japanese Patent App. Pub. No. JP H07-335357 (A), Pub. Date Dec. 22, 1995, downloaded on Aug. 18, 2020, from https://worldwide.espacenet.com.
Japanese Patent Abstract (in English) of Japanese Patent App. Pub. No. JP S56-13389 (U), Pub. Date Feb. 4, 1981.
Office Action (in Chinese) for Taiwan Patent Application No. TW 105130565, dated Jun. 17, 2020.
Office Action (in Japanese) for Japanese Patent Application No. JP 2018-508663, dated Aug. 11, 2020.
Japanese Patent Abstract (in English) of JP Pub. No. 2003-272805 A, Pub. Date Sep. 26, 2003, from http://worldwide.espacenet.com.
Notification from the Japan Patent Office (in Japanese) of JP Patent Application No. 2018-508663, dated Mar. 23, 2021.
Korean Patent Abstract (in English) of KR Pub. No. 10-1439279 B1, Pub. Date Sep. 11, 2014, downloaded Jun. 4, 2021, from http://worldwide.espacenet.com.
Office Action (in Korean) from Korean Intellectual Property Office, of KR Patent Application No. 10-2015-0139849, dated May 18, 2021.

* cited by examiner

| WIRE DIAMETER (mm) | LENGTH (mm) | CROSS-SECTION AREA (mm²) | INITIAL RESISTANCE (Ω) | CURRENT APPLIED (A) | AMOUNT OF GENERATED HEAT (W) |
|---|---|---|---|---|---|
| 0.50 | 104.55 | 0.196 | 0.030 | 14.5 | 6.27 |
| 0.60 | 104.55 | 0.283 | 0.021 | 14.5 | 4.35 |
| 0.70 | 104.55 | 0.385 | 0.015 | 14.5 | 3.20 |
| 0.80 | 104.55 | 0.502 | 0.012 | 14.5 | 2.45 |
| 0.90 | 104.55 | 0.636 | 0.009 | 14.5 | 1.94 |
| 1.00 | 104.55 | 0.785 | 0.007 | 14.5 | 1.57 |

FIG. 4

SUBSTRATE HEATING APPARATUS WITH ENHANCED TEMPERATURE UNIFORMITY CHARACTERISTIC

CROSS-REFERENCE TO RELATED APPLICATIONS

This application is the national stage entry for International Patent Cooperation Treaty Application PCT/KR2016/010960, filed on Sep. 30, 2016, which claims priority from Korean Patent Application No. 10-2015-0139849, filed on Oct. 5, 2015, in the Korean Intellectual Property Office. The entire contents of said applications are the incorporated herein by reference for all purposes.

BACKGROUND OF THE INVENTION

Technical Field

The present invention relates to an apparatus and a method for changing a color of weather presenter's costume in real time based on weather information. The present invention relates to a substrate heating apparatus. More specifically, the present invention relates to a substrate heating apparatus including a first heating element located in an inner region of the substrate heating apparatus, a second heating element located in an outer region, and a third heating element delivering current to the second heating element passing through the inner region, wherein the diameter of a wire constituting the third heating element is thicker than the diameter of a wire constituting the second heating element, thereby inhibiting the generation of an overheating region by the heating of the third heating element.

Background Art

In general, in order to manufacture a flat panel display or a semiconductor device, a series of layers including a dielectric layer and a metal layer are consecutively layered and patterned on a substrate such as a glass substrate, a flexible substrate or a semiconductor substrate. And, the series of layers including the dielectric layer and metal layer, etc. are deposited on the substrate by processes such as chemical vapor deposition (CVD) or physical vapor deposition (PVD).

In this case, in order to form the layers uniformly, the substrate needs to be heated in a uniform temperature, and in order to heat and support the substrate, a substrate heating apparatus may be used. The substrate heating apparatus may be used to heat the substrate in processes for etching the dielectric layer or metal layer formed on the substrate, processes for plasticizing a photoresistor, etc.

Further, recently there are constant requests for a method that can reduce temperature deviation of the substrate heating apparatus according to the needs for fine wiring of the semiconductor device and precise heat-treating on the semiconductor device. In particular, since a supporting part which supports the body part, which is made of ceramic, etc. and installed with a heating element, is located in the center region of the substrate heating apparatus, there is a problem that the thermal capacity increases. Due to this problem, even if the same quantity of heat is supplied to each region of the substrate heating apparatus, temperature deviation may occur between each region.

In this regard, as can be seen from FIG. 1, by dividing the substrate heating apparatus into an inner region (region B in FIG. 1) and an outer region (region C in FIG. 1) and controlling the heating of the substrate for each region, there has been an attempt to develop a technology which can reduce the temperature deviation between the inner region (region B in FIG. 1) and the outer region (region C in FIG. 1). However, in this case, due to the heating in an electric conductor to supply current to the heating element in the outer region (region C in FIG. 1), there may be a problem that a specific region (region A in FIG. 1) corresponding to the electric conductor may be overheated. For example, FIG. 2 illustrates the problem that a specific region (region A in FIG. 2) corresponding to the electric conductor is overheated due to the heating in the electric conductor delivering current to the heating element in the outer region passing through the inner region.

Accordingly, there has been a request for a method that can solve the problem that a specific region (region A in FIG. 2) is overheated due to the heating in the electric conductor supplying current to the heating element in the outer region while controlling the heating by dividing the substrate heating apparatus into the inner region and outer region. However, no proper solution has been provided yet.

SUMMARY OF THE INVENTION

Technical Problem

One or more embodiments of the present invention was designed to solve the problems above. It is an object of the present invention to provide a substrate heating apparatus that can prevent the overheating of a specific region due to the heating by an electric conductor supplying current to a heating element in an outer region while dividing the substrate heating apparatus into a plurality of regions including an inner region and an outer region and controlling the heating for each region.

Also, it is an object of the present invention to provide a substrate heating apparatus that can minimize the non-uniformity of substrate heating due to the heating by an electric conductor in a center region while dividing the substrate heating apparatus into a plurality of regions including an inner region, an outer region and a center region passing through the inner region and heating each region.

Also, it is an object of the present invention to provide a structure that can improve the thermal, structural stability of a connecting structure of a heating element of the outer region and an electric conductor supplying current thereto.

Technical Solution

In order to achieve the above technical task, a substrate heating apparatus according to an aspect of the present invention is a substrate heating apparatus for heating a substrate, including a body part supporting the substrate, a first heating element located in an inner region of the body part, a second heating element located in an outer region surrounding the inner region, and a third heating element delivering current to the second heating element passing through the inner region of the body part, wherein the diameter of a wire constituting the third heating element is thicker than the diameter of a wire constituting the second heating element.

Here, the second heating element and the third heating element may be made of one wire, and the part connecting the second heating element and the third heating element may have a tapering shape.

Also, the part connecting the second heating element and the third heating element may be bonded by welding.

Also, the substrate heating apparatus may further include a connecting member electrically connecting the second heating element and the third heating element, and the second heating element, the third heating element and the connecting member may all be made of the same material.

In this case, the connecting member may include an opening fixing wires with different diameters constituting the second heating element and the third heating element by press-fitting.

Also, the third heating element may be located in an intermediate region passing through the inner region, from the center region including a center point of the body part to the outer region, and the first heating element may not be located in the intermediate region.

Here, the first heating element, the second heating element and the third heating element may form a symmetrical shape with respect to a center axis of the intermediate region passing through the center point of the body part.

Also, with respect to a symmetrical region which is symmetrical to the intermediate region with respect to the center point of the body part, the average surface temperature by the heating of the first heating element and the third heating element at the center axis of the intermediate region passing through the center point of the body part may be substantially the same as the average surface temperature by the heating of the first heating element at the center axis of the symmetrical region passing through the center point of the body part.

Also, with respect to a symmetrical region which is symmetrical to the intermediate region with respect to the center point of the body part, the difference between the maximum and minimum surface temperatures by the heating of the first heating element and the third heating element at the center axis of the intermediate region passing through the center point of the body part may be smaller than or equal to the difference between the maximum and minimum surface temperatures by the heating of the first heating element at the center axis of the symmetrical region passing through the center point of the body part.

Advantageous Effects

The present invention may prevent the overheating of a specific region due to the heating by a third heating element by increasing the diameter of a wire of the third heating element supplying current to a second heating element located in an outer region thicker than the diameter of a wire of the second heating element while dividing a substrate heating apparatus into a plurality of regions including an inner region and an outer region and controlling the heating for each region.

Also, the present invention may minimize the non-uniformity of substrate heating due to the heating by an electric conductor in the intermediate region by adjusting the sum of the amount of generated heat of the third heating element and the amount of generated heat of the second heating element in the intermediate region to a predetermined range while dividing a substrate heating apparatus into a plurality of regions including an inner region, an outer region and an intermediate region passing through the inner region and heating each region.

Also, the present invention may maintain thermal, structural stability even under temperature change according to heating during a process of manufacturing a substrate heating apparatus and a substrate process by connecting the outer heating element and intermediate heating element using a connecting body made of the same material as the outer heating element and the intermediate heating element.

BRIEF DESCRIPTION OF THE DRAWINGS

The accompanying drawings, which are incorporated in and form a part of the detailed description to help understand the present invention, illustrate embodiments of the present invention and serve to explain the technical idea of the present invention together with the detailed description.

FIG. 4 is a table illustrating the change of amount of generated heat according to the diameter of a wire of a third heating element as an embodiment of the present invention;

DETAILED DESCRIPTION

Description of the Preferred Embodiments

Mode of the Invention

Various modifications may be made to the present invention and the present invention may have various embodiments within the scope of the claims. Hereinafter, specific embodiments will be described in detail with reference to the accompanying drawings.

In the detailed description, if it is determined that detailed description on known relevant technologies may obscure the gist of the present invention, the detailed description thereof will be omitted.

The terms "first," "second," etc. may be used to explain various components, but the components shall not be limited to these terms. These terms are used only to distinguish one component from another component.

Hereinafter, exemplary embodiments of a substrate heating apparatus according to the present invention are explained in detail with reference to the accompanying drawings.

As mentioned in the above, in the case of dividing the regions of the substrate heating apparatus into a plurality of regions including an inner region and an outer region and heating each region in order to increase thermal uniformity of the substrate heating apparatus, there may be a problem such that a specific region is overheated due to the heating in an electric conductor to deliver current to a heating element in the outer region passing through the inner region.

In this regard, the present invention discloses a substrate heating apparatus including a first heating element located in an inner region of the substrate heating apparatus, a second heating element located in an outer region, and a third heating element delivering current to the second heating element passing through the inner region, wherein the diameter of a wire constituting the third heating element is thicker than the diameter of a wire constituting the second heating element, thereby inhibiting the generation of an overheating region by the heating of the third heating element.

Figure 1:
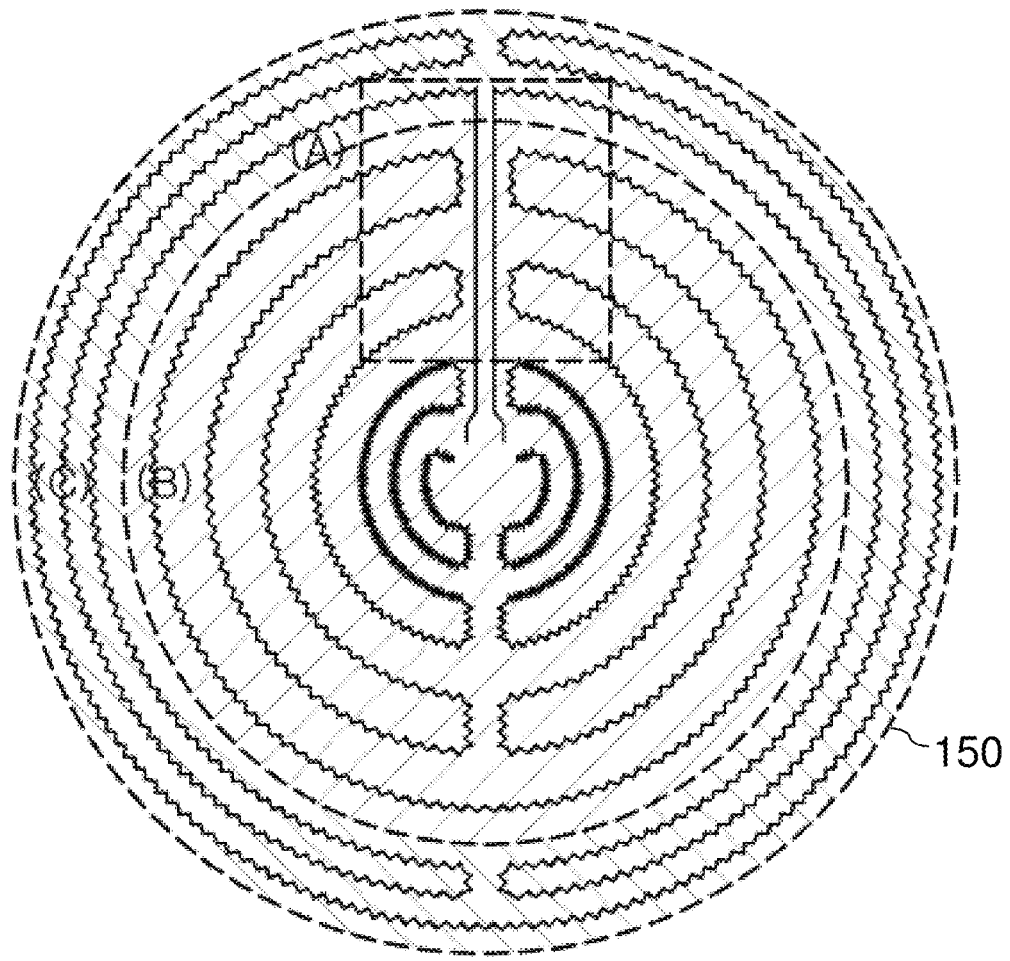
FIG. 1 is a top view of a substrate heating apparatus according to conventional art.
Figure 3A:
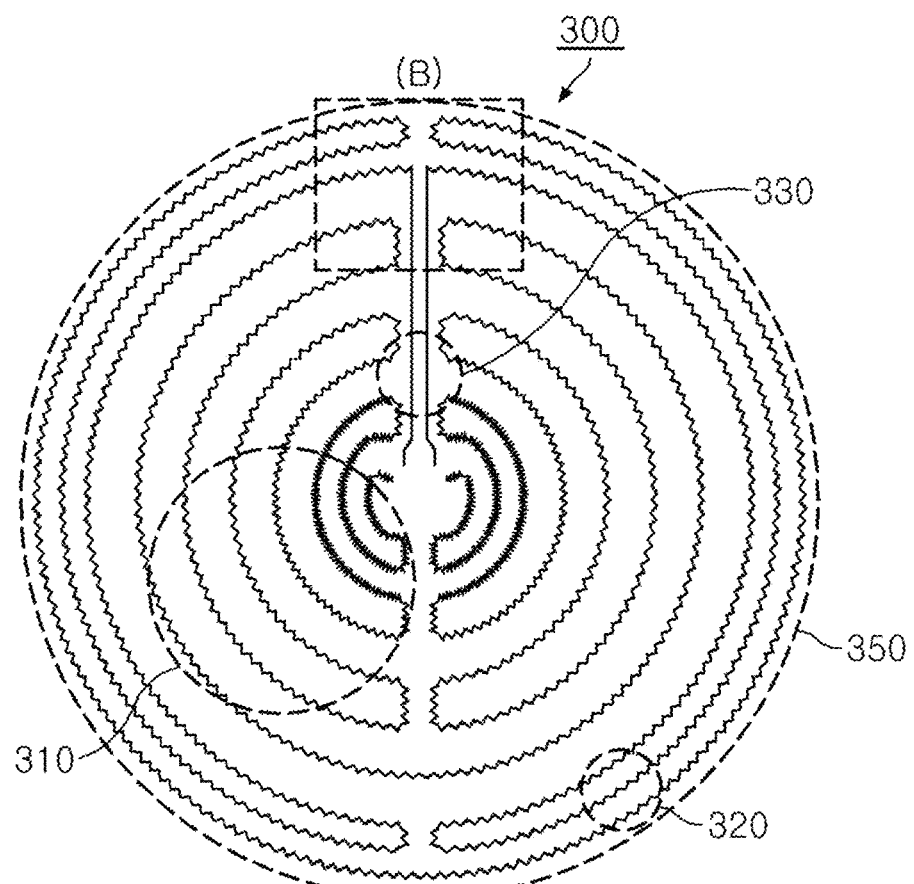
FIGS. 3A, 3B and 3C are exemplary views of a structure of a substrate heating apparatus according to an embodiment of the present invention.
Figure 3B:
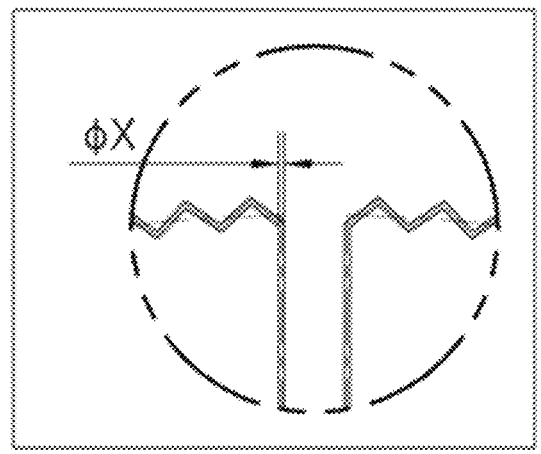

FIGS. 3A and 3B exemplify a structure of the substrate heating apparatus 300 according to an embodiment of the present invention. As can be seen from FIG. 3A, the substrate heating apparatus 300 according to an embodiment of the present invention may include a body part (350, which corresponds to body part 150 of the prior art device shown in FIG. 1) supporting the substrate, a first heating element 310 located in an inner region of the body part, a second heating element 320 located in an outer region surrounding the inner region, and a third heating element 330 delivering current to the second heating element 320 passing through the inner region of the body part. In this case, the diameter of a wire constituting the third heating element 330 is formed to be thicker than the diameter of a wire constituting the second heating element 320, so as to prevent a specific region from being overheated by the heating of the third heating element 330 by lowering the resistance of the third heating element 330 and inhibiting the heating in the third heating element 330.

In this case, the substrate heating apparatus 300 goes through a process of layering and patterning a series of layers including a dielectric layer and a metal layer on a substrate such as a glass substrate, a flexible substrate or a semiconductor substrate by processes such as chemical vapor deposition (CVD) or physical vapor deposition (PVD). In this case, the substrate heating apparatus 300 heats the substrate uniformly at a predetermined temperature required by the process.

The body part (not shown) of the substrate heating apparatus 300 may be made using ceramic or metal, etc. according to its use or the process used. A heating element for heating the substrate may be included in the body part together with a high frequency electrode (not shown) used in the plasma process, etc. In addition, a plurality of pin holes (not shown) may be formed in the substrate heating apparatus 300 to mount the substrate on the top surface of the body part or allow lift pins for unloading the substrate to move outward.

In order for the stability, etc. in the high temperature process, the body part of the substrate heating apparatus 300 may be made of a ceramic material. The ceramic that can be used in this case may be $Al_2O_3$, $Y_2O_3$, $Al_2O_3/Y_2O_3$, $ZrO_2$, AlC, TiN, AlN, TiC, MgO, CaO, $CeO_2$, $TiO_2$, $B_xC_y$, BN, $SiO_2$, SiC, YAG, Mullite, $AlF_3$, etc., and two or more of the ceramics may be used together.

The heating element may be formed using tungsten (W), molybdenum (Mo), silver (Ag), gold (Au), platinum (Pt), niobium (Nb), titanium (Ti) or alloys thereof.

As can be seen from FIG. 3B, in general, the substrate heating apparatus may have a heating structure divided into a plurality of regions by constituting the second heating element 320 and the third heating element 330 using one wire of the same diameter. However, in this case, when applying electric power to the second heating element 320 in the outer region for heating, heat the same as that in the second heating element 320 occurs in the third heating element 330, and thus there may be a problem that the intermediate region where the third heating element 330 is located may be overheated.

Figure 2:
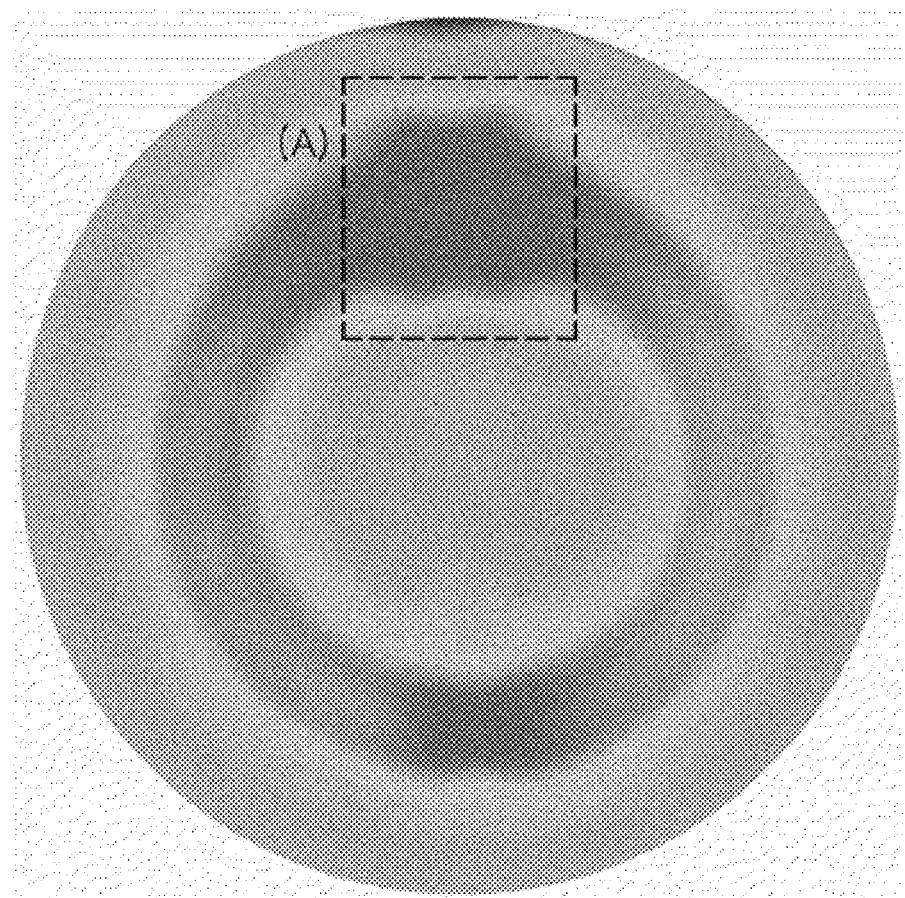
FIG. 2 is a view illustrating a case where a specific region is overheated by non-uniform heating in a substrate heating apparatus according to conventional art.

In particular, as heat in the first heating element 310 adjacent to the intermediate region is added to the amount of generated heat by the third heating element 330, the intermediate region may be further heated. Accordingly, as illustrated in FIG. 2, there is a problem that a specific region is overheated and the thermal uniformity deteriorates greatly.

In this regard, in order to reduce the effect of heating in the first heating element 310, it may be considered to separate the first heating element 310 from the third heating element 330. However, in this case, depending on the status of electrical power which is applied to each region, the amount of generated heat in the intermediate region where the third heating element 330 is located may be greatly different from the amount of generated heat in the symmetrical region which is symmetrical to the intermediate region with respect to the center point of the body part, and thus in some cases, the thermal uniformity of the substrate heating apparatus may be worse.

Thus, it is preferable that the structure of the first heating element 310 in the intermediate region is symmetrical to the structure of the first heating element 310 in the symmetrical region corresponding thereto, if possible. Also, even if they cannot have the symmetrical structure for the wiring, etc. of the third heating element 330, it is preferable to configure the structure to be as similar as possible.

Figure 3C:
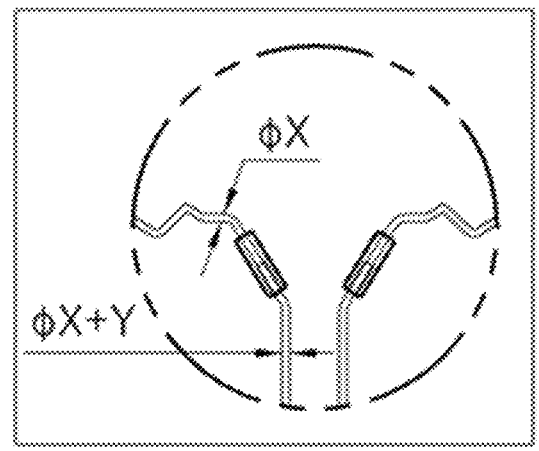

Thus, it is more preferable to reduce the amount of generated heat in the third heating element 330 while maintaining the symmetrical structure of the first heating element 310 as much as possible. Accordingly, in the present invention, as can be seen from FIG. 3C, the heating by the third heating element 330 is to be inhibited by reducing the resistance by increasing the diameter ($\Phi X+Y$) of the wire constituting the third heating element 330 to be larger than the diameter ($\Phi X$) of the wire constituting the second heating element.

Also, in the substrate heating apparatus 300 according to an embodiment of the present invention, by not locating the first heating element 310 in the intermediate region where the third heating element 330 is located, it is preferable to prevent the first heating element 310 and the third heating element 330 from being arranged overlapping each other and to have them arranged separate from each other, thereby reducing the effect of overlapping the heating of the first heating element 310 and the third heating element 330.

Further, as can be seen from FIG. 3A, the substrate heating apparatus 300 according to an embodiment of the present invention does not necessarily have to be configured by dividing the substrate heating apparatus into two regions of an inner region and an outer region. It may be configured in a plurality of regions, further including at least one region in addition to the inner region and the outer region.

Also, with respect to the center axis of the intermediate region passing through the center point of the body part, the first heating element 310, the second heating element 320, and the third heating element 330 form a symmetrical shape, so that the substrate heating apparatus 300 according to an embodiment of the present invention may have a symmetrical thermal distribution with respect to the center axis, and the thermal uniformity of the substrate heating apparatus 300 may be further improved.

FIG. 4 illustrates a table calculating the resistance and amount of generated heat of the wire configuring the third heating element while varying the diameter of the wire according to an embodiment of the present invention. As can be seen from FIG. 4, when the diameter of a wire configuring the third heating element is 0.50 mm, the resistance of the wire is 0.030Ω, and when a current of 14.5 Å is applied to the wire, the wire presents an amount of generated heat of 6.27 W.

In comparison, when the diameter of the wire configuring the third heating element is 1.00 mm, the resistance of the wire is 0.007Ω, and when a current of 14.5 Å is applied to the wire, the wire presents an amount of generated heat of 1.57 W. Thus, it can be confirmed that as the diameter of the wire increases two times from 0.50 mm to 1.00 mm, the resistance and amount of generated heat drop to a level of about ¼, respectively.

Similarly, it can be confirmed that as the diameter of the wire configuring the third heating element increases by about 1.4 times from 0.5 mm to 0.70 mm, the resistance and amount of generated heat drop to a level of about ½, respectively.

Thus, the amount of generated heat by the wire may be reduced by increasing the diameter of the wire. Further, since the diameter of the wire cannot be increased unlimitedly, it is preferable to adjust the amount of generated heat in the intermediate region where the third heating element 330 is located to be close to the amount of generated heat in other regions, in consideration of diameter of the wire, distance between the wires, and heating by the first heating element, etc.

Figure 5A:
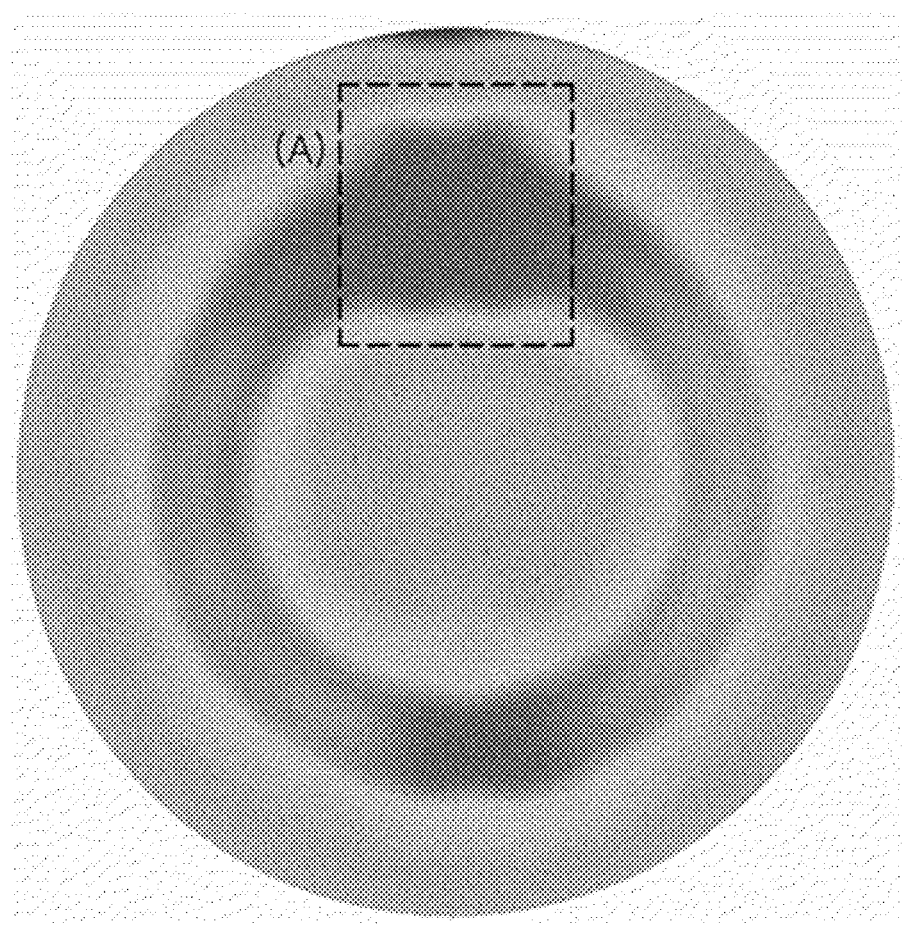
FIGS. 5A and 5B are views illustrating a case where the overheating of a specific region is overcome in a substrate heating apparatus according to an embodiment of the present invention.
Figure 5B:
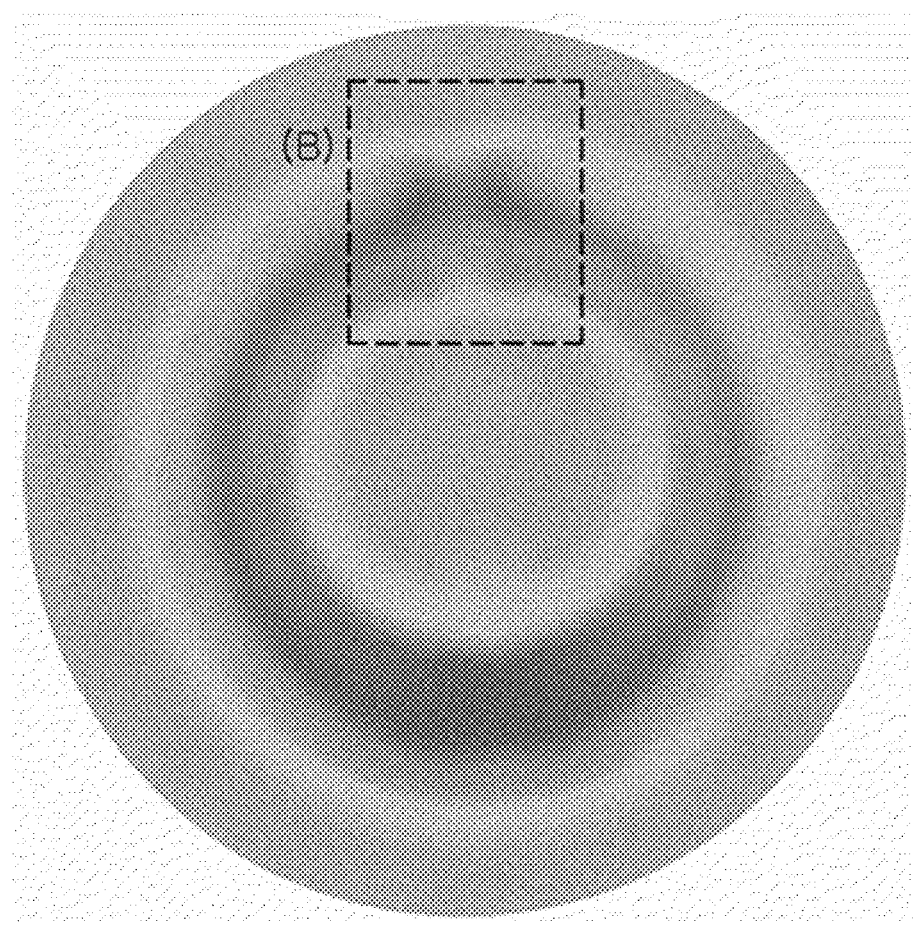

FIGS. 5A and 5B illustrate cases where the thermal uniformity is improved by inhibiting the overheating in a specific region in a substrate heating apparatus 300 according to an embodiment of the present invention. As can be seen from FIG. 5A, in case the heating by the third heating element 330 in the intermediate region is not properly inhibited, the amount of generated heat may be concentrated in the intermediate region and overheated (area (A) in FIG. 5A). However, as can be seen from FIG. 5B, in the substrate heating apparatus 300 according to an embodiment of the present invention, by having the diameter of the wire configuring the third heating element 330 to be thicker than the diameter of the wire configuring the second heating element 320, the overheating in the intermediate region may be inhibited effectively by lowering the resistance of the third heating element 330 and inhibiting the heating by the third heating element 330 (area (B) in FIG. 5B).

Figure 6A:
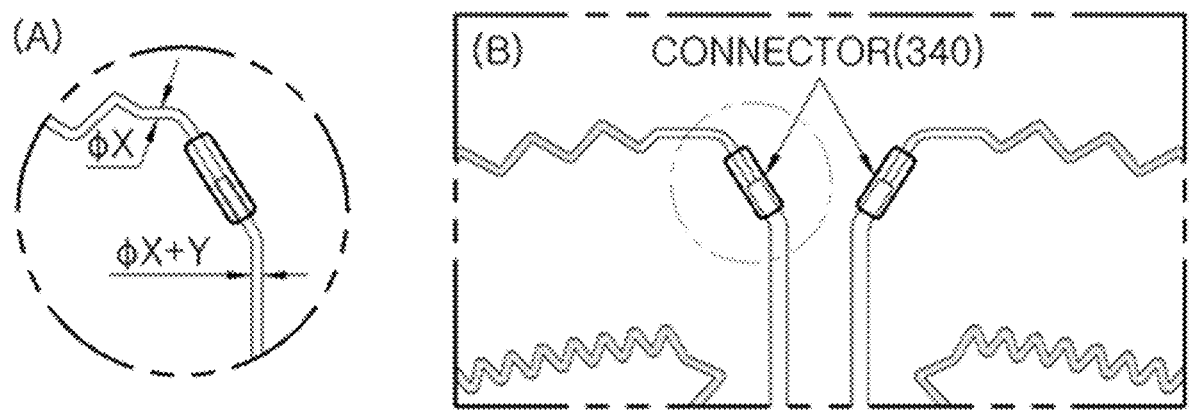
FIGS. 6A, 6B and 6C are views exemplifying a structure of a connecting member connecting a second heating element and a third heating element in a substrate heating apparatus according to an embodiment of the present invention.

FIG. 6A illustrates a drawing exemplifying a structure of a connecting member connecting a second heating element 320 and a third heating element 330 in a substrate heating apparatus according to an embodiment of the present invention. As can be seen from (A) in FIG. 6A, as an embodiment of the present invention, the second heating element 320 and the third heating element 330 may be configured of separate wires having different diameters of ΦX, and ΦX+Y. Thus, as can be seen from (B) in FIG. 6A, the second heating element 320 may be connected to the third heating element 330 using a connecting member 340 connecting the second heating element 320 and the third heating element 330.

In this case, the connecting member 340 may include an opening fixing wires with different diameters configuring the second heating element 320 and the third heating element 330 by press-fitting. Further, the second heating element 320, the third heating element 330 and the connecting member 340 may all be made of the same material.

Accordingly, the second heating element 320, the third heating element 330 and the connecting member 340 may maintain its combination structure stably even in high temperature environment, etc. in the manufacturing process of the substrate heating apparatus 300 according to an embodiment of the present invention such as plasticizing of ceramic, etc. or in the substrate treating process such as chemical vapor deposition (CVD), etc. for the substrate.

Figure 6B:
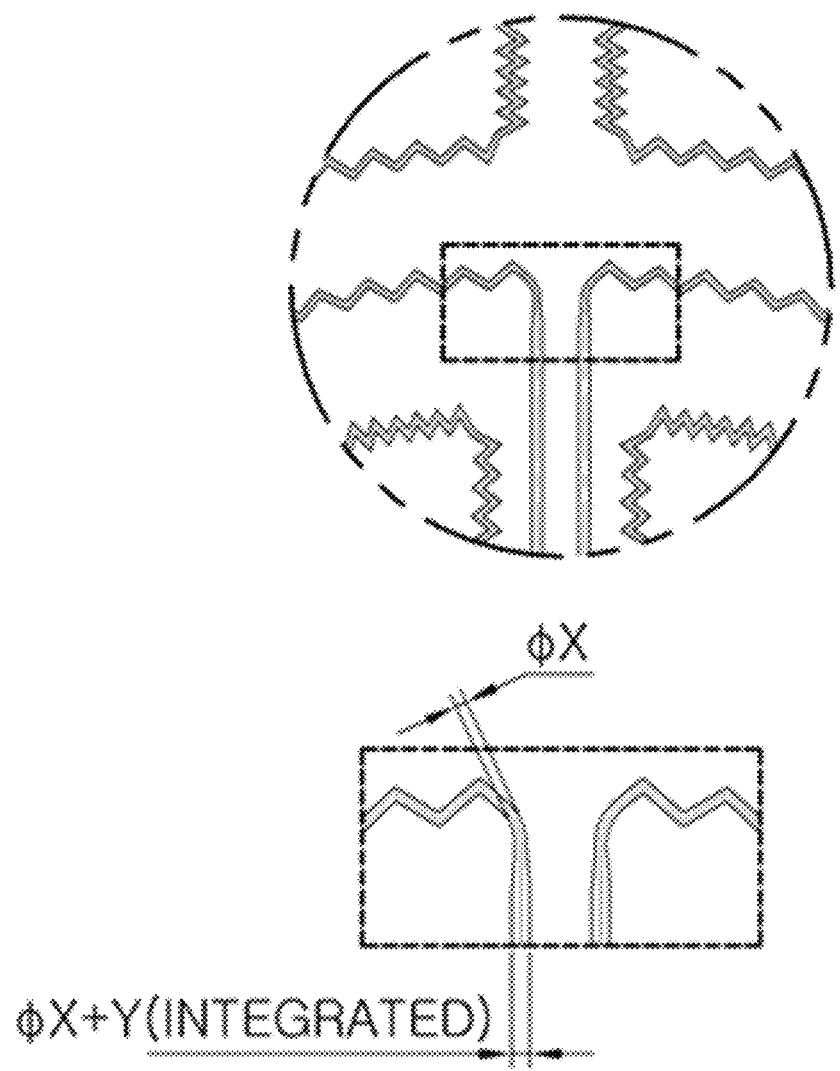
Figure 6C:
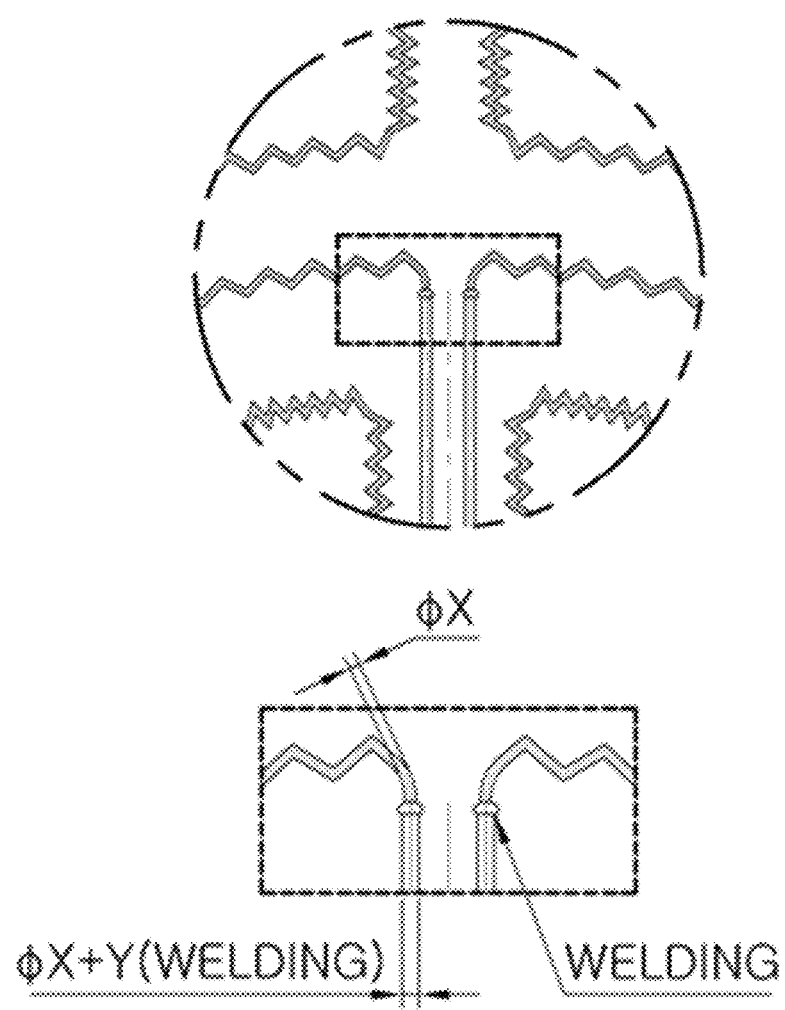

Further, the connecting member 340 does not necessarily have to be used in the substrate heating apparatus 300 according to an embodiment of the present invention. As a more specific example, as can be seen from FIG. 6B, while configuring the second heating element 320 and the third heating element 300 with one wire, the connecting part of the second heating element 320 and the third heating element 330 may be formed to have a tapering shape. In this case, the thermal, structural stability in the connecting part of the second heating element 320 and the third heating element 330 may be further improved. Thus, the connecting structure may be maintained more stably even under very high temperature or repetitive thermal environmental change. Alternatively, as can be seen from FIG. 6C, the connecting part of the second heating element 320 and the third heating element 330 may be bonded by welding, etc.

Figure 7:
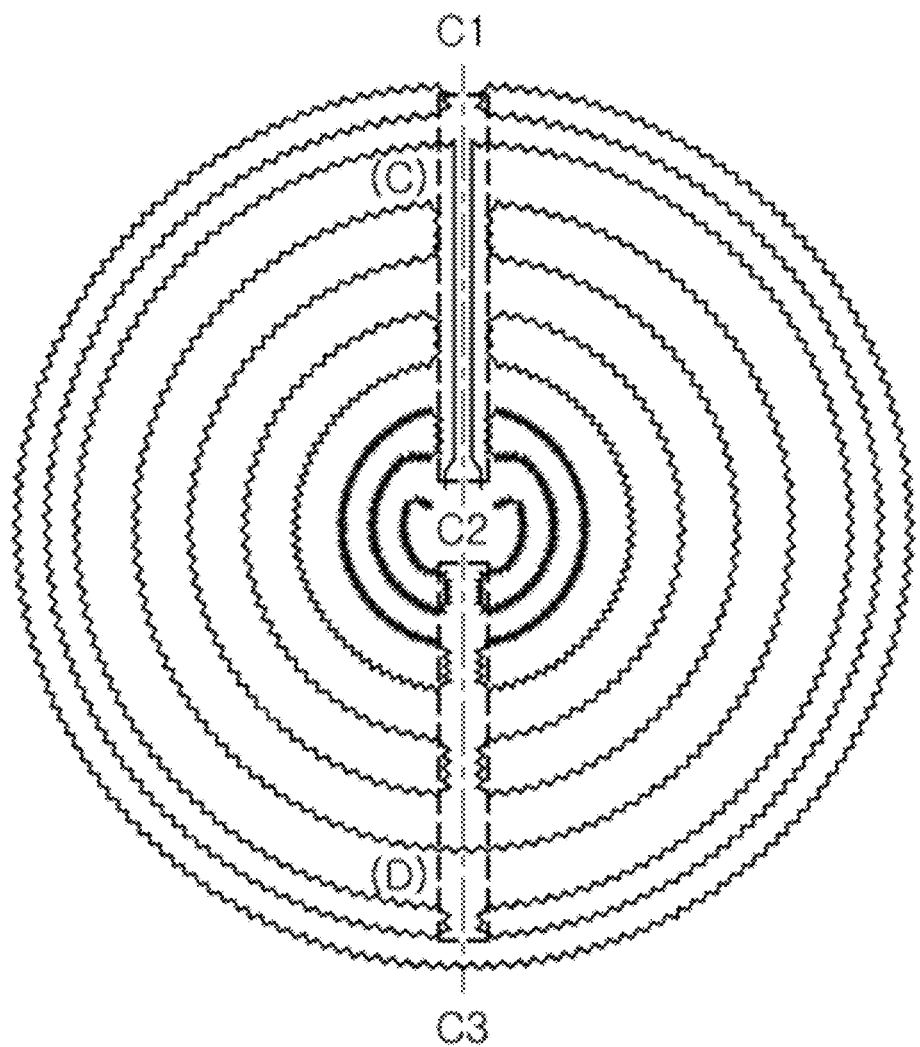
FIG. 7 is a view for explaining the case of reducing the deviation between the amount of generated heat of an intermediate region and the amount of generated heat of a symmetrical region in a substrate heating apparatus as an embodiment of the present invention.

FIG. 7 explains a structure reducing the deviation between the amount of generated heat in the intermediate region (region C in FIG. 7) and the amount of generated heat in the symmetrical region (region D in FIG. 7) of the substrate heating apparatus 300 as an embodiment of the present invention. That is, with regard to a symmetrical region which is symmetrical to the intermediate region with respect to the center point of the body part in the substrate heating apparatus 300, the average surface temperature by the heating of the first heating element 310 and the third heating element 330 at the center axis (C1-C2 in FIG. 7) of the intermediate region passing through the center point of the body part may be substantially the same as the average surface temperature by the heating of the first heating element 310 at the center axis (C2-C3 in FIG. 7) of the symmetrical region passing through the center point of the body part. To this end, the diameter of the third heating element 330 around the center axis in the intermediate region, the separation distance between the neighboring wires of the third heating element 330, the separation distance between the third heating element 330 and the first heating element 310, etc. may be adjusted.

Accordingly, the thermal uniformity of the substrate heating apparatus 300 according to an embodiment of the present invention may be improved by making the temperature at the center axis of the intermediate region the same as the average surface temperature at the center axis of the symmetrical region.

Also, as another embodiment of the present invention, the thermal uniformity of the substrate heating apparatus 300 according to an embodiment of the present invention may be improved by having the difference between the maximum and minimum surface temperatures by the heating of the first heating element 310 and the third heating element 330 at the center axis (C1-C2 in FIG. 7) of the intermediate region (region C in FIG. 7) passing through the center point of the body part to be smaller than or equal to the difference between the maximum and minimum surface temperatures by the heating of the first heating element 310 at the center axis (C2-C3 in FIG. 7) of the symmetrical region (region D in FIG. 7) passing through the center point of the body part.

Figure 8:
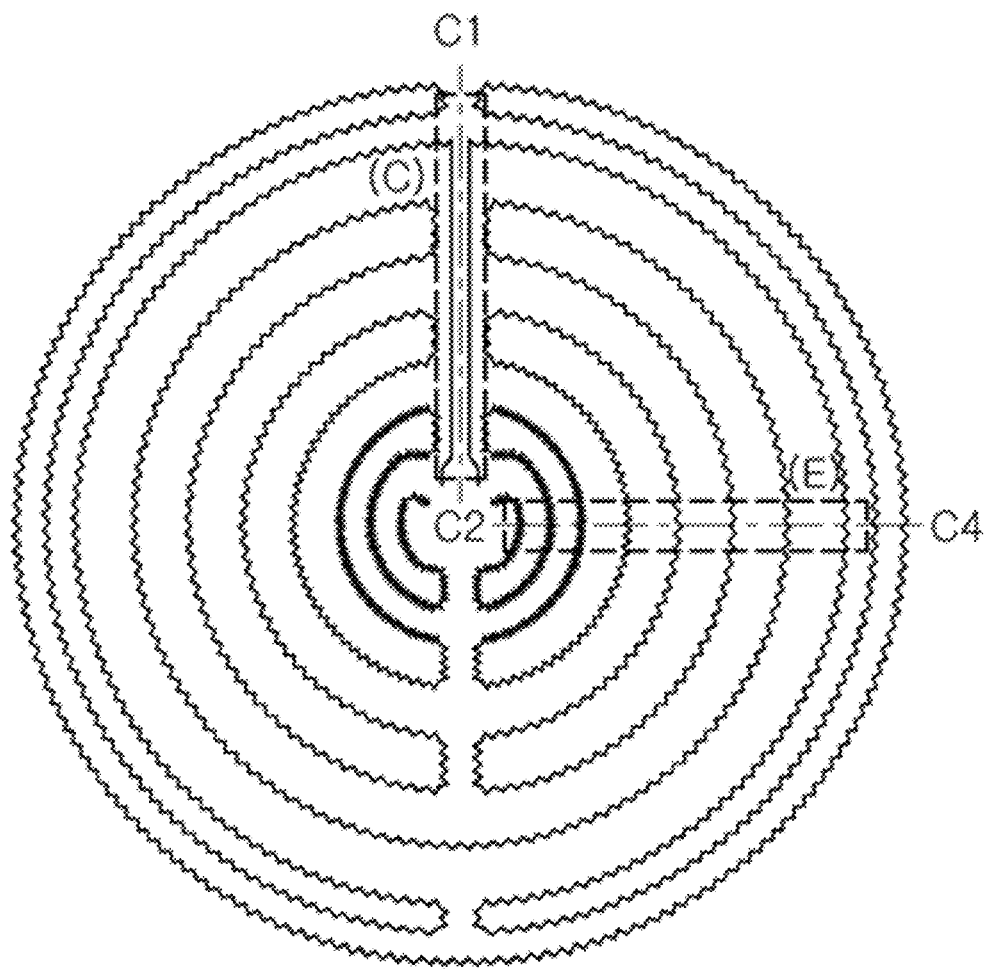
FIG. 8 is a view for explaining the case of reducing the deviation between the amount of generated heat of an intermediate region and the amount of generated heat of a region perpendicular to the intermediate region in a substrate heating apparatus as an embodiment of the present invention.

FIG. 8 explains a structure reducing the deviation between the amount of generated heat in the intermediate region (region C in FIG. 8) and the amount of generated heat in the region (region E in FIG. 8) perpendicular to the intermediate region of the substrate heating apparatus 300 as an embodiment of the present invention. First, with regard to the intermediate region and the region perpendicular to the intermediate region in the substrate heating apparatus 300, the average surface temperature by the heating of the first heating element 310 and the third heating element 330 at the center axis (C1-C2 in FIG. 8) of the intermediate region passing through the center point of the body part may be substantially the same as the average surface temperature by the heating of the first heating element 310 at the center axis (C2-C4 in FIG. 8) of the region perpendicular to the intermediate region. To this end, the diameter of the third heating element 330 around the center axis in the intermediate region, the separation distance between the neighboring wires of the third heating element 330, the separation distance between the third heating element 330 and the first heating element 310, etc. may be adjusted.

Accordingly, the thermal uniformity of the substrate heating apparatus 300 according to an embodiment of the present invention may be improved by making the temperature at the center axis of the intermediate region the same as the average surface temperature at the center axis of the region perpendicular to the intermediate region.

Also, as another embodiment of the present invention, the thermal uniformity of the substrate heating apparatus 300 according to an embodiment of the present invention may be improved by having the difference between the maximum and minimum surface temperatures by the heating of the first heating element 310 and the third heating element 330 at the center axis (C1-C2 in FIG. 8) of the intermediate region (region C in FIG. 8) passing through the center point of the body part to be smaller than or equal to the difference between the maximum and minimum surface temperatures by the heating of the first heating element 310 at the center axis (C2-C4 in FIG. 8) of the region (region E in FIG. 8) perpendicular to the intermediate region.

The present invention has an effect of disclosing a substrate heating apparatus for heating a substrate, including a body part supporting the substrate, a first heating element located in an inner region of the body part, a second heating element located in an outer region surrounding the inner region, and a third heating element delivering current to the second heating element passing through the inner region of the body part, wherein the diameter of a wire constituting the third heating element is thicker than the diameter of a wire constituting the second heating element.

Although exemplary embodiments of the present invention have been described for illustrative purposes, those skilled in the art will appreciate that various modifications, additions and substitutions are possible without departing from the essential characteristics of the present invention. Therefore, exemplary embodiments of the present invention have not been described for limiting the technical idea of the present invention. Accordingly, the scope of the present invention is not limited by the above embodiments but by the claims and equivalents thereof.

DESCRIPTION OF REFERENCE NUMERALS

300: substrate heating apparatus
310: first heating element
320: second heating element
330: third heating element
340: connecting member

What is claimed is:

1. A substrate heating apparatus for heating a substrate, comprising:
    a body part supporting the substrate;
    a first heating element located in an inner region of the body part;
    a second heating element located in an outer region surrounding the inner region;
    a third heating element delivering current to the second heating element passing through the inner region of the body part; and
    a connecting member electrically connecting the second heating element and the third heating element,
    wherein the second heating element, the third heating element and the connecting member are all made of the same material,
    wherein the connecting member comprises a first opening and a second opening fixing wires with different diameters constituting the second heating element and the third heating element by press-fitting,
    wherein the second heating element and the third heating element are wires made of single material to be connected electrically to the connecting member by press-fitting,
    wherein the diameter of a wire constituting the third heating element is thicker than the diameter of a wire constituting the second heating element, and
    wherein, with regard to the intermediate region and the region perpendicular to the intermediate region in the substrate heating apparatus, the average surface temperature by the heating of the first heating element and the third heating element at a center axis of the intermediate region passing through a center axis of the body part is substantially the same as the average surface temperature at the center axis of the region perpendicular to the intermediate region.

2. The substrate heating apparatus of claim 1, wherein the connecting member comprises the first opening at one side and the second opening fixing the third heating element at the opposite side of the one side by press-fitting.

3. The substrate heating apparatus of claim 1, wherein the third heating element is located in an intermediate region passing through the inner region, from the center region including the center point of the body part to the outer region, and the first heating element is not located in the intermediate region.

4. The substrate heating apparatus of claim 3, wherein the first heating element, the second heating element and the third heating element form a symmetrical shape with respect to the center axis of the intermediate region passing through the center point of the body part.

5. The substrate heating apparatus of claim 3, wherein with respect to a symmetrical region which is symmetrical to the intermediate region with respect to the center point of the body part, the average surface temperature by the heating of the first heating element and the third heating element at the center axis of the intermediate region passing through the center point of the body part is substantially the same as the average surface temperature by the heating of the first heating element at the center axis of the symmetrical region passing through the center point of the body part.

6. The substrate heating apparatus of claim 3, wherein with respect to a symmetrical region which is symmetrical to the intermediate region with respect to the center point of the body part, the difference between the maximum and minimum surface temperatures by the heating of the first heating element and the third heating element at the center axis of the intermediate region passing through the center point of the body part is smaller than or equal to the difference between the maximum and minimum surface temperatures by the heating of the first heating element at the center axis of the symmetrical region passing through the center point of the body part.

* * * * *